US011270970B2

(12) United States Patent
Takahashi

(10) Patent No.: US 11,270,970 B2
(45) Date of Patent: Mar. 8, 2022

(54) SEMICONDUCTOR DEVICE

(71) Applicant: FUJI ELECTRIC CO., LTD., Kawasaki (JP)

(72) Inventor: Masaki Takahashi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/038,522

(22) Filed: Sep. 30, 2020

(65) Prior Publication Data

US 2021/0118837 A1    Apr. 22, 2021

(30) Foreign Application Priority Data

Oct. 21, 2019    (JP) .............................. JP2019-191912

(51) Int. Cl.
*H01L 23/00*    (2006.01)
(52) U.S. Cl.
CPC ............... *H01L 24/45* (2013.01); *H01L 24/05* (2013.01); *H01L 2924/10272* (2013.01); *H01L 2924/351* (2013.01); *H01L 2924/365* (2013.01)
(58) Field of Classification Search
CPC ...................... H01L 24/45; H01L 24/05; H01L 2924/10272; H01L 2924/351; H01L 2924/365

USPC ......................................................... 257/784
See application file for complete search history.

(56) References Cited

U.S. PATENT DOCUMENTS 6,486,548 B1 * 11/2002 Nakatsu ................. H01L 25/18
257/690
2013/0201316 A1 * 8/2013 Binder .................... H04L 67/12
348/77

FOREIGN PATENT DOCUMENTS

JP    2006-066704 A    3/2006

\* cited by examiner

*Primary Examiner* — Elias Ullah
(74) *Attorney, Agent, or Firm* — Rabin & Berdo, P.C.

(57) ABSTRACT

A semiconductor device, including a semiconductor chip having a first main electrode on a front surface thereof, the first main electrode having a plurality of bonded regions, and a plurality of wires that are bonded respectively to the plurality of bonded regions of the first main electrode. In a top view of the semiconductor device, the plurality of bonded regions do not overlap in either a predetermined first direction, or a second direction perpendicular to the predetermined first direction.

14 Claims, 12 Drawing Sheets

SEMICONDUCTOR DEVICE

CROSS-REFERENCE TO RELATED APPLICATION

This application is based upon and claims the benefit of priority of the prior Japanese Patent Application No. 2019-191912, filed on Oct. 21, 2019, the entire contents of which are incorporated herein by reference.

BACKGROUND OF THE INVENTION

1. Field of the Invention

The embodiment discussed herein relates to a semiconductor device.

2. Background of the Related Art

Semiconductor devices are equipped with semiconductor chips including semiconductor elements, such as IGBT (Insulated Gate Bipolar Transistors) and FWD (Free Wheeling Diodes). Surface electrodes of the semiconductor chips are electrically connected using wires made of metal, such as aluminum or copper. These semiconductor devices are used as power converter devices. When configuring the devices, the wires are bonded to the surface electrodes as close as possible to edge portions of the surface electrodes, and in particular at corner portions. This is to avoid center portions of the surface electrodes where the temperature is the highest when the semiconductor chip is powered, and also to avoid contact between the wires themselves. In addition, by making the bonding areas of wires on the surface electrodes larger, it is possible to reduce the heat that is generated per wire and to avoid breakages due to differences in thermal stress between the wires and the surface electrodes.

See, for example, Japanese Laid-open Patent Publication No. 2006-066704.

Miniaturization of semiconductor chips has been progressing in recent years. This places limits on the bonding areas of wires on the surface electrodes of semiconductor chips, so that it is not possible to make the bonding areas larger. Due to this, the amount of heat generated at the bonding locations of wires on a semiconductor chip when the semiconductor chip is powered has also increased. When a semiconductor chip is miniaturized, even when wires are bonded to the corner portions of a surface electrode, the gaps between the wires will be smaller, resulting in thermal interference between the bonding locations of the wires and a rise in the temperature of the wires and the surface electrodes of the semiconductor chip. This causes breakages due to differences in thermal stress between the wires and the surface electrodes and a drop in reliability for a semiconductor device including the semiconductor chips.

SUMMARY OF THE INVENTION

According to an aspect, there is provided a semiconductor device which includes: a semiconductor chip having a first main electrode on a front surface thereof, the first main electrode having a plurality of bonded regions; and a plurality of wires that are bonded respectively to the plurality of bonded regions of the first main electrode, wherein in a top view of the semiconductor device, no two of the plurality of bonded regions overlap in a predetermined first direction, or in a second direction perpendicular to the predetermined first direction.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

An embodiment will be described below with reference to the accompanying drawings. Note that in the following description, the expressions "front surface" and "upper surface" refer to the surface of a semiconductor device 10 that faces upward in FIG. 1. In the same way, the expression "up" refers to the upward direction for the semiconductor device 10 in FIG. 1. The expressions "rear surface" and "lower surface" refer to the surface of the semiconductor device 10 that faces downward in FIG. 1. In the same way, the expression "down" refers to the downward direction for the semiconductor device 10 in FIG. 1. These expressions indicate the same directions as needed in the other drawings. The expressions "front surface", "upper surface", "up", "rear surface", "lower surface", "down", and "side surface" are merely convenient expressions used to specify relative positional relationships, and are not intended to limit the technical scope of the present embodiment. As one example, "up" and "down" do not always mean directions that are perpendicular to the ground. That is, the "up" and "down" directions are not limited to the direction of gravity.

Figure 1:
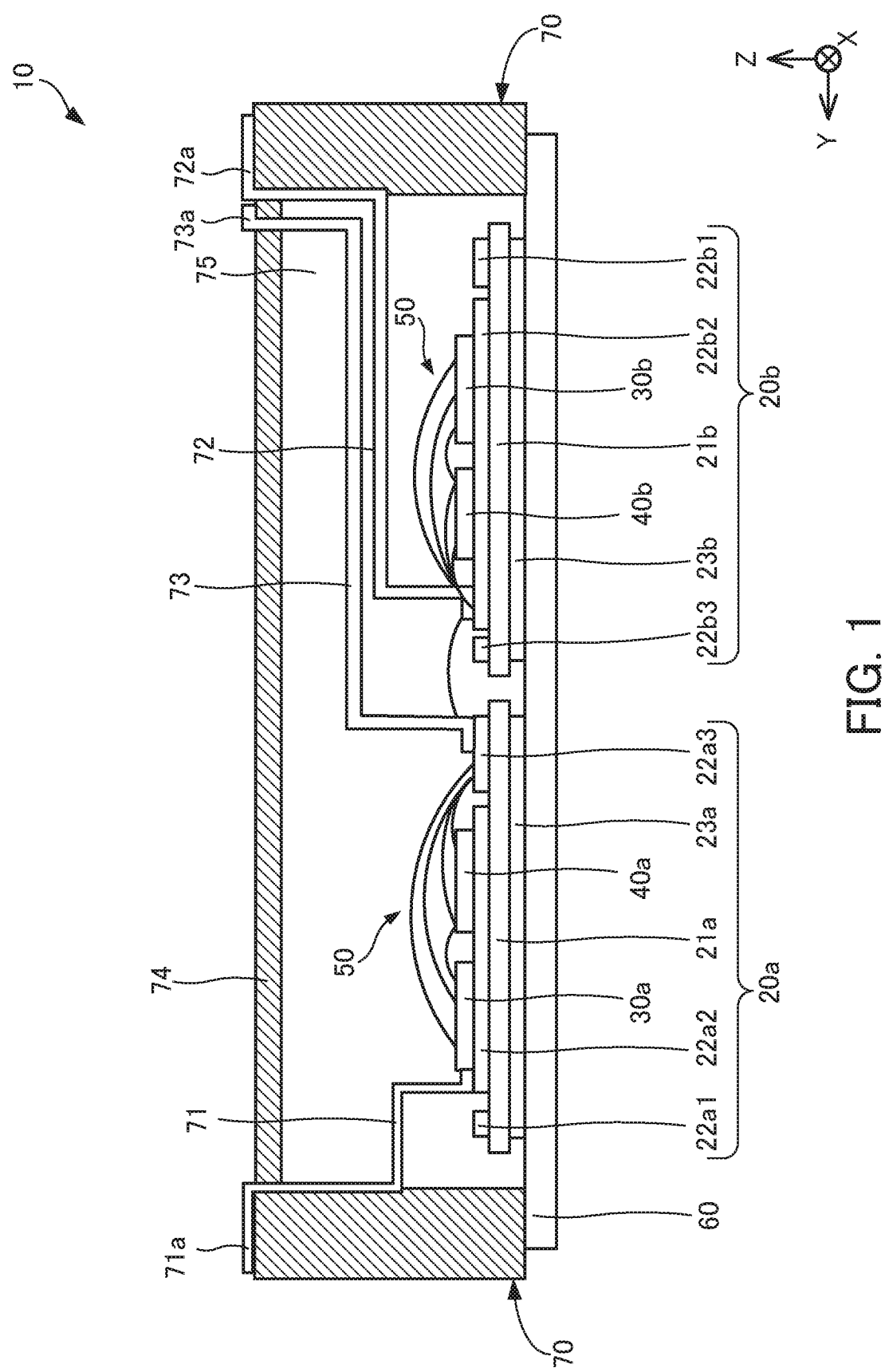
FIG. 1 is a cross-sectional side view of a semiconductor device.
Figure 2:
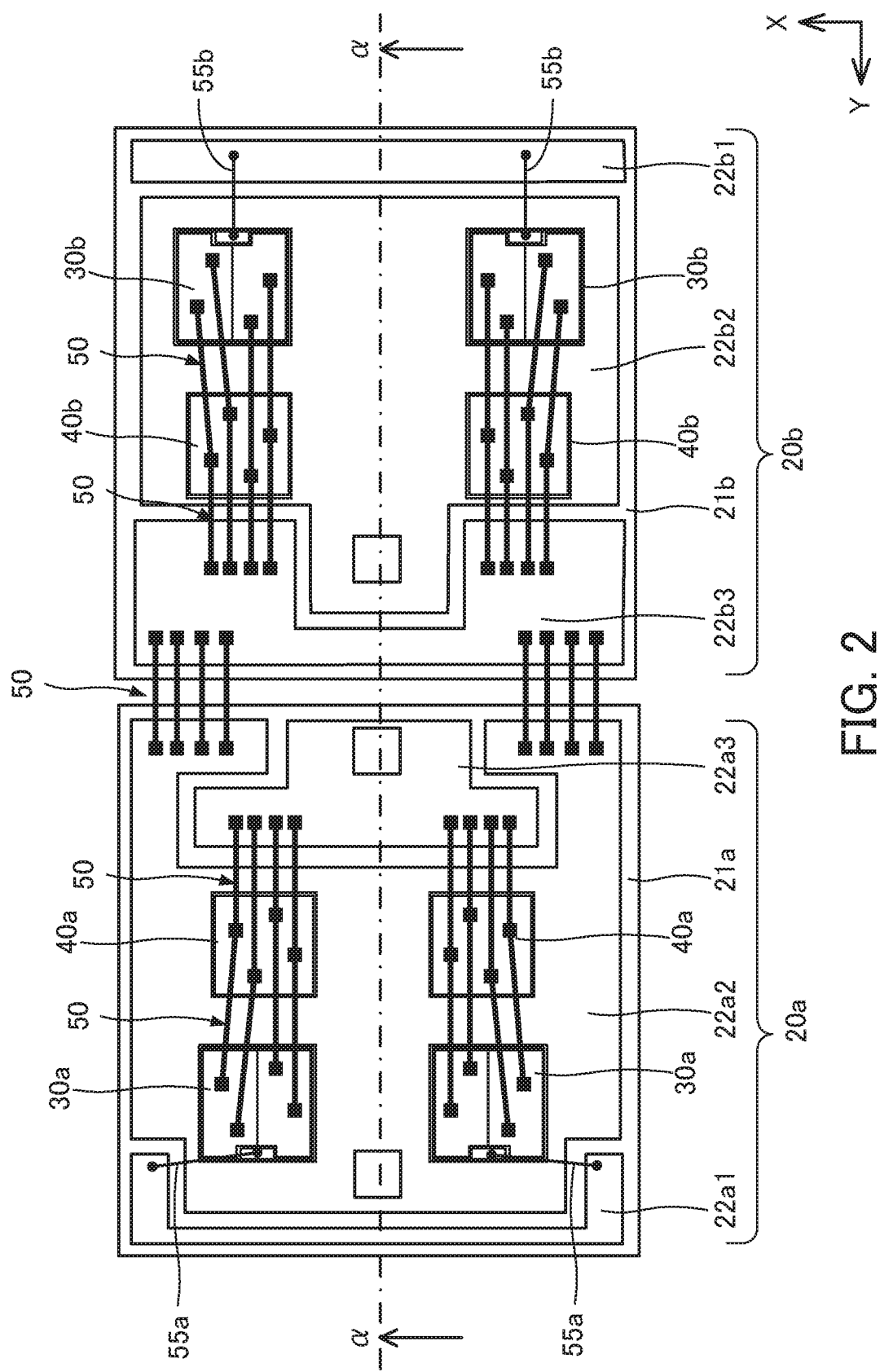
FIG. 2 is a plan view of the semiconductor device.

A semiconductor device according to the present embodiment will now be described with reference to FIGS. 1 and 2. FIG. 1 is a cross-sectional side view of the semiconductor device and FIG. 2 is a plan view of the semiconductor device. Note that FIG. 1 is a cross-sectional view at a position corresponding to the dot-dash line a-a in FIG. 2. In FIG. 2, only ceramic circuit boards 20a and 20b of the semiconductor device 10 are illustrated.

As depicted in FIG. 1, the semiconductor device 10 includes the ceramic circuit boards 20a and 20b, and a heat dissipating plate 60 which is provided via solder (not illustrated) on the ceramic circuit boards 20a and 20b. As depicted in FIG. 2, semiconductor chips 30a, 30b, 40a, and 40b are disposed on the ceramic circuit boards 20a and 20b. The semiconductor device 10 also includes a case portion 70, which is provided via adhesive (not illustrated) at edge portions of the heat dissipating plate 60 and surrounds the ceramic circuit boards 20a and 20b, and a lid portion 74, which is provided at an upper opening in the case portion 70. Wiring members 71, 72, and 73 are attached to the case portion 70 and the lid portion 74. One end of the wiring member 71 is electrically connected to the ceramic circuit board 20a and the other end is exposed as a terminal 71a on the case portion 70. One end of the wiring member 72 is electrically connected to the ceramic circuit board 20b, and the other end is exposed as a terminal 72a on the case portion 70. One end of the wiring member 73 is electrically connected to the ceramic circuit board 20a, and the other end is exposed as a terminal 73a on the case portion 70. The ceramic circuit boards 20a and 20b inside the case portion 70 are sealed using a sealing member 75, such as silicone gel or sealing resin.

As depicted in FIGS. 1 and 2, the ceramic circuit boards 20a and 20b include insulating boards 21a and 21b, conductive patterns 22a1 to 22a3 and 22b1 to 22b3 formed on the front surfaces of the insulating boards 21a and 21b, and metal plates 23a and 23b formed on the rear surfaces of the insulating boards 21a and 21b. Note that the shapes, numbers, and layout of the conductive patterns 22a1 to 22a3 and 22b1 to 22b3 are mere examples. The insulating boards 21a and 21b are made of ceramics with high thermal conductivity, such as aluminum oxide, aluminum nitride, and silicon nitride which have superior thermal conductivity. The conductive patterns 22a1 to 22a3 and 22b1 to 22b3 are made of a metal with superior conductivity, such as copper or copper alloy. The metal plates 23a and 23b are made of a metal such as aluminum, iron, silver, copper, or an alloy containing at least one of these metals which have superior thermal conductivity. As examples of the ceramic circuit boards 20a and 20b with this configuration, a DCB (Direct Copper Bonding) board or an AMB (Active Metal Brazed) board may be used. The ceramic circuit boards 20a and 20b transmit heat that has been generated in the semiconductor chips 30a, 30b, 40a, and 40b downward in FIG. 1 via the conductive patterns 22a2 and 22b2, the insulating boards 21a and 21b, and the metal plates 23a and 23b to externally emit the heat. Note that the thickness of the conductive patterns 22a1 to 22a3 and 22b1 to 22b3 is preferably at least 0.10 mm but no greater than 1.00 mm, and more preferably at least 0.20 mm but no greater than 0.50 mm. The wiring member 71 is bonded to the conductive pattern 22a2 of the ceramic circuit board 20a via solder (not illustrated). The wiring member 72 is bonded to the conductive pattern 22b2 via solder (not illustrated). The wiring member 73 is bonded to the conductive pattern 22a3 via solder (not illustrated). Note that the squares illustrated on the conductive patterns 22a2, 22b2, and 22a3 represent the bonding regions of the wiring members 71, 72, and 73.

The semiconductor chips 30a and 30b are made of silicon or silicon carbide and include switching elements, such as IGBTs and power MOSFETs (Metal Oxide Semiconductor Field Effect Transistors). As one example, the semiconductor chips 30a and 30b each have input electrodes (drain electrodes or collector electrodes) as main electrodes on the rear surface and control electrodes (gate electrodes) and output electrodes (source electrodes or emitter electrodes) as main electrodes on the front surface. The rear surfaces of the semiconductor chips 30a and 30b described above are connected to the conductive patterns 22a2 and 22b2 by solder (not illustrated). The semiconductor chips 40a and 40b are made of silicon or silicon carbide and include FWD elements such as SBD (Schottky Barrier Diodes) and PiN (P-intrinsic-N) diodes. The semiconductor chips 40a and 40b are equipped with output electrodes (cathode electrodes) as main electrodes on their rear surfaces and input electrodes (anode electrodes) as main electrodes on their front surfaces. The rear surfaces of the semiconductor chips 40a and 40b are connected to the conductive patterns 22a2 and 22b2 by solder (not illustrated).

Wires 50 like those described below are used to wire the ceramic circuit boards 20a and 20b to the semiconductor chips 30a, 30b, 40a, and 40b. Note that in FIGS. 1 and 2, the expression "wires 50" is a general name for any wire that connects components but is not control wiring. Wires 55a and 55b, which are control wiring, electrically connect the conductive patterns 22a1 and 22b1 and the gates of the semiconductor chips 30a and 30b, respectively. The other wires 50 provide electrical connections between the semiconductor chips 30a and 30b, the semiconductor chips 40a and 40b, and the conductive patterns 22a3 and 22b3 as appropriate. Note that the wires 50 are made of a metal, such as aluminum or copper, that has superior conductivity, or an alloy containing at least one of these metals. The diameters of the wires 50 are at least 100 µm but no greater than 1.00 mm and preferably at least 250 µm but no greater than 500 µm. When the wire diameter is smaller than 250 µm, the allowable current per wire is low, which needs a large number of wires. This would increase the number of bonding locations on the semiconductor chips 30a, 30b, 40a, and 40b, and the amount of heat generated at the bonding locations would increase when the chips are powered. When the wire diameter is larger than 500 µm, excessive force is needed when bonding to the semiconductor chips 30a, 30b, 40a, and 40b, which may damage the semiconductor chips 30a, 30b, 40a, and 40b.

The wiring members 71, 72, and 73 are made of aluminum, iron, silver, or copper, which have superior electrical conductivity, or an alloy containing at least one of these metals. To improve corrosion resistance, as one example, a metal such as nickel or gold may be formed on the surfaces of the wiring members 71, 72, and 73 by a plating process or the like. In more detail, aside from nickel and gold, it is also possible to use nickel-phosphorus alloy, nickel-boron alloy, or the like. It is also possible to form a gold layer on top of nickel-phosphorus alloy.

As examples, the heat dissipating plate 60 is made of aluminum, iron, silver, or copper, which have superior thermal conductivity, or an alloy containing at least one of these metals. Also, to improve corrosion resistance, a material such as nickel may be formed on the surface of the heat dissipating plate 60 by a plating process or the like. In more detail, aside from nickel, it is possible to use nickel-phosphorus alloy, nickel-boron alloy, or the like. Note that a radiator (not illustrated) may be attached to the rear surface side of the heat dissipating plate 60 via solder, silver solder, or the like to improve the dissipation of heat. As examples, the radiator used here is made of aluminum, iron, silver, or copper, which have superior thermal conductivity, or an alloy containing at least one of these metals. A cooling device including a fin or a heat sink composed of a plurality of fins and a cooling device that uses water cooling or the like may also be used as the radiator. The heat dissipating plate 60 may be integrally formed with this type of radiator. In that case, the integrated structure is made of aluminum, iron, silver, or copper that have superior thermal conductivity, or an alloy containing at least one of these materials. To improve corrosion resistance, as one example, a material such as nickel may be formed on the surface of the heat dissipating plate 60 that is integrated with the radiator by a plating process or the like. In more detail, aside from nickel, it is possible to use a nickel-phosphorus alloy, a nickel-boron alloy, or the like. As examples, the case portion 70 and the lid portion 74 are formed in the shapes of a box and a flat plate, respectively, and are made of thermoplastic resin. Example resins include PPS resin, PBT resin, PBS resin, PA resin, and ABS resin. The case portion 70 and the lid portion 74 are formed with holes (not illustrated) into which the terminals 71a, 72a, and 73a of the wiring members 71, 72, and 73 are inserted.

Figure 3:
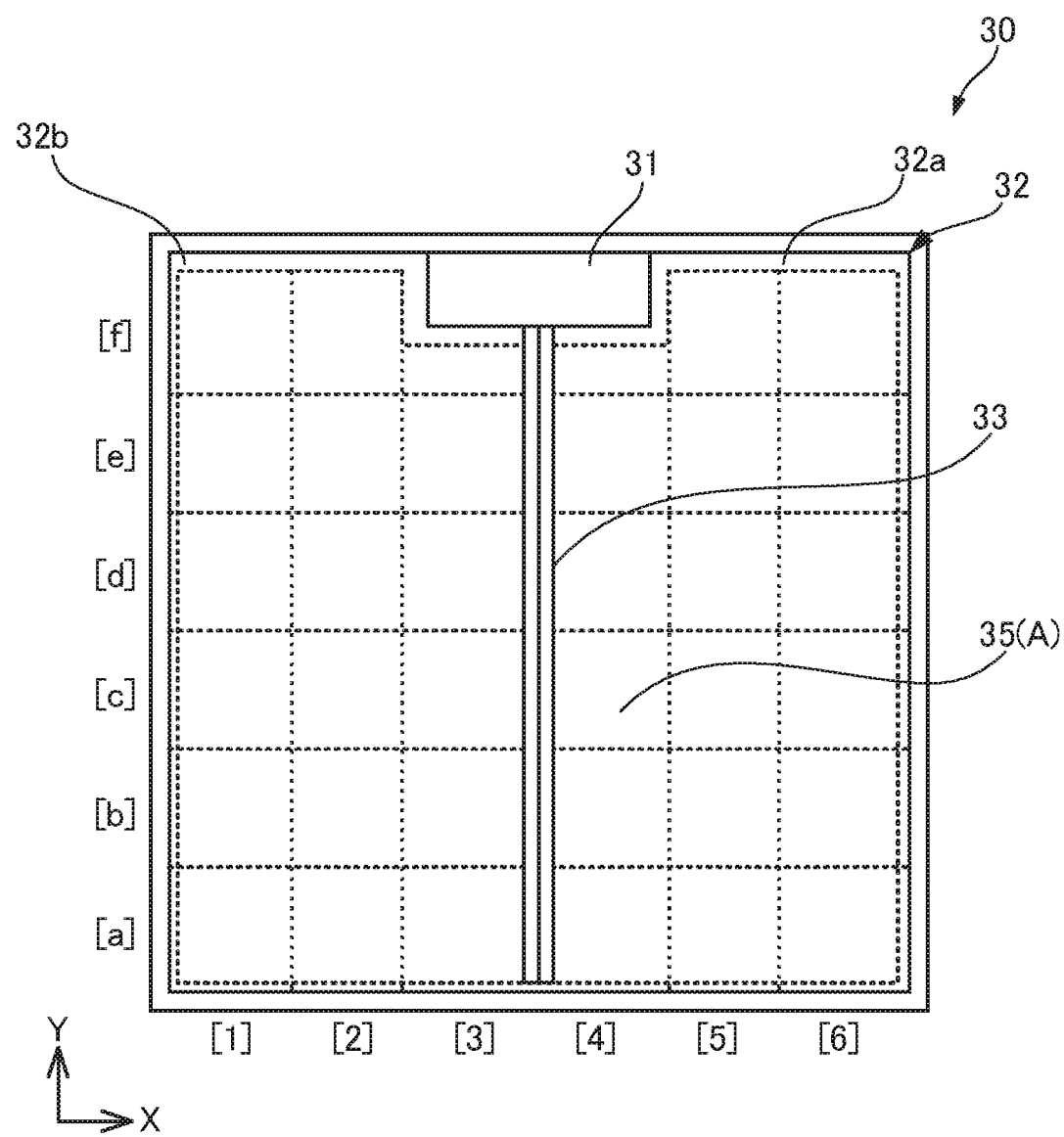
FIG. 3 is a plan view of a semiconductor chip.

Next, the semiconductor chips 30a and 30b will be described in detail with reference to FIG. 3. Note that the generic term "semiconductor chip 30" is used hereinafter for the semiconductor chips 30a and 30b. FIG. 3 is a plan view of a semiconductor chip. The semiconductor chip 30 is rectangular in shape when viewed from above, and has a gate 31 (control electrode portion) located in the center of one end portion on the front surface, an active region 32 (output electrode portion), and a gate runner 33 that extends from the gate 31 to the active region 32. Note that as an example size, the semiconductor chip 30 is 7 mm or shorter in each of the vertical and horizontal directions.

A control voltage is inputted into the gate 31. The active region 32 is a region where the wires 50 are bonded and where output currents are outputted when the semiconductor chip 30 is on. As depicted in FIG. 3, the active region 32 is composed of electrode regions 32a and 32b that are disposed with the gate runner 33 in between. The electrode regions 32a and 32b are transistor regions that are each provided with a plurality of IGBTs. The electrode regions 32a and 32b are insulated from each other, and output independent output currents. The gate runner 33 is provided along a boundary portion between the electrode regions 32a and 32b that are the transistor regions. Note that the electrode regions 32a and 32b will be described in detail later. The gate runner 33 is electrically connected to the gate of each IGBT (or power MOSFET) in the electrode regions 32a and 32b.

In addition, a plurality of bonding regions 35 are set in a grid along the X and Y directions on the front surfaces of the electrode regions 32a and 32b of the semiconductor chip 30. These bonding regions 35 are regions where the wires 50 are able to be bonded. One wire 50 is able to be bonded to each bonding region 35. In the example in FIG. 3, six bonding regions 35 are set in each of the vertical and horizontal directions, making a total of thirty-six bonding regions. Note that in FIG. 3, for explanatory purposes, [1] to [6] have been assigned along the X (horizontal) direction, and [a] to [f] have been assigned in the Y (vertical) direction. The bonding regions 35 are indicated here as needed as "A", so that out of the 36 bonding regions 35, the bonding region 35 corresponding to the position [3] in the X direction and the position [c] in the Y direction is indicated as "A3c".

Figure 4:
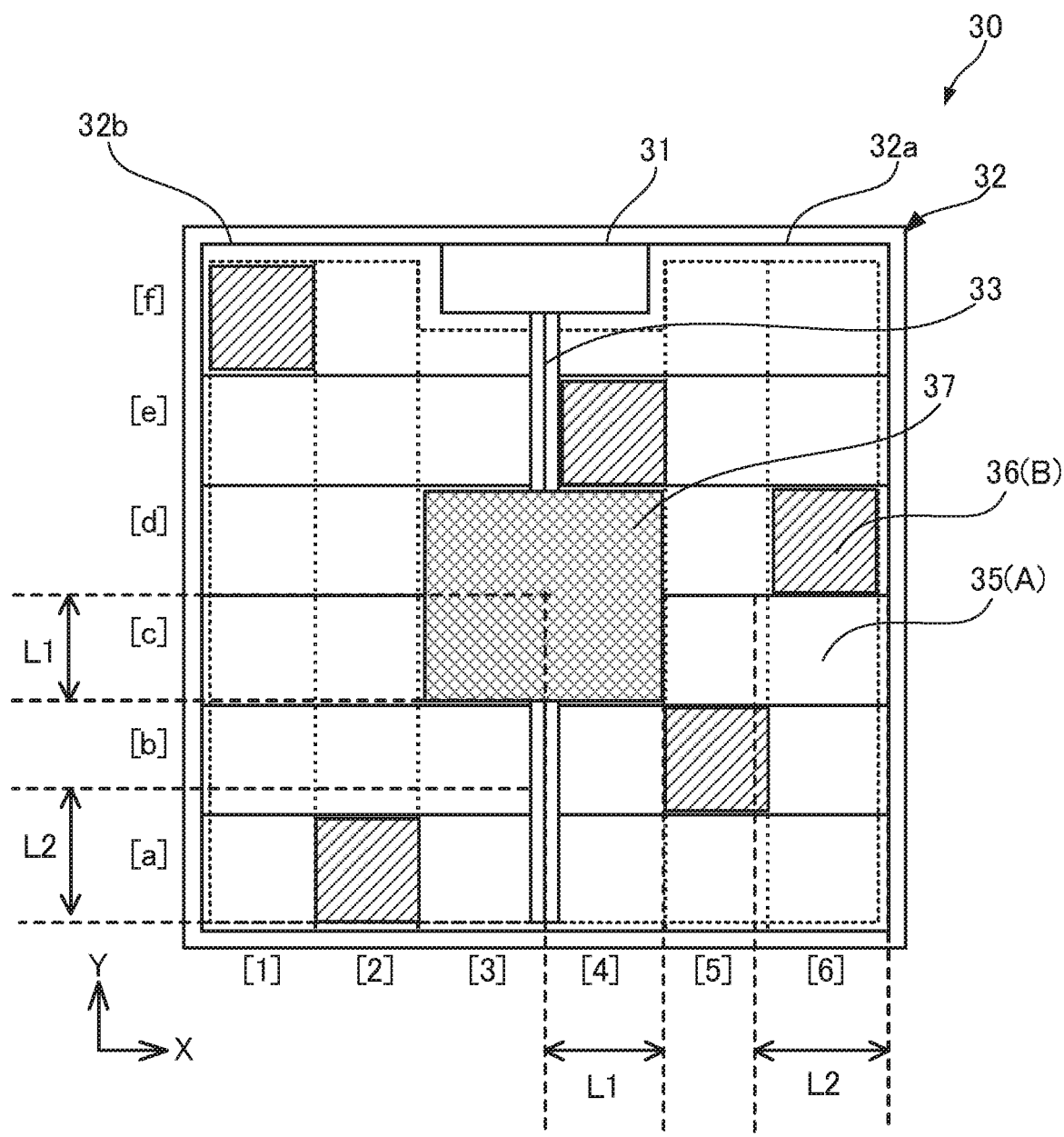
FIG. 4 depicts bonding locations of wires on a semiconductor chip according to the present embodiment.

Next, the bonding locations of wires on a semiconductor chip 30 will be described with reference to FIG. 4. FIG. 4 depicts bonding locations of wires on a semiconductor chip according to the present embodiment. Note that an example case where five wires 50 are bonded to the electrode regions 32a and 32b of the semiconductor chip 30 will be described with reference to FIG. 4. The configuration described below is not limited to the semiconductor chip 30 and may also be applied to semiconductor chips 40a and 40b.

In FIG. 4, to bond the five wires 50, six bonding regions 35 are set along each of the X direction and the Y direction in a grid in the electrode regions 32a and 32b of the semiconductor chip 30. The bonding regions 35 may be set in a grid where the entire lengths along the X direction and the Y direction are divided by the number of wires 50 or a larger number. A total of five wires 50 are individually bonded to five different bonded regions 36 (the diagonally shaded areas in FIG. 4) out of the plurality of bonding regions 35 in the electrode regions 32a and 32b of the semiconductor chip 30 depicted in FIG. 4. When doing so, the plurality of bonded regions 36 in the electrode regions 32a and 32b to which the individual wires 50 are bonded are laid out so that when viewed from above, the bonded regions 36 do not coincide along the X direction, which is parallel to one side of the semiconductor chip 30, and the Y direction, which is perpendicular to the X direction. Note that the bonded regions 36 are indicated here as needed as "B", so that as one example, out of the five bonded regions 36, the bonded region 36 corresponding to the position [5] in the X direction and [b] in the Y direction is indicated as "B5b".

As examples, out of the five bonded regions 36, the bonded regions 36 (B2a, B4e, B5b, B6d) aside from the bonded region 36 (B1f) will now be described. These bonded regions 36 (B2a, B4e, B5b, B6d) are set so as to not coincide with bonding regions 35 (A1f to A6f, A1a to A1f) that are aligned in the X and Y directions with the bonded region 36 (B1f), out of all of the bonding regions 35. That is, the bonded regions (B2a, B4e, B5b, B6d) aside from the bonded region 36 (B1f) are provided in bonding regions 35 aside from the bonding regions 35 (A1f to A6f, A1a to A1f) that include the bonded region 36 (B1f). The bonded regions (B1f, B4e, B5b, B6d) aside from the bonded region 36 (B2a) are provided with the same relationship to the bonded region 36 (B2a), the bonded regions (B1f, B2a, B5b, B6d) aside from the bonded region 36 (B4e) are provided with the same relationship to the bonded region 36 (B4e), the bonded regions (B1f, B2a, B4e, B6d) aside from the bonded region 36 (B5b) are provided with the same relationship to the bonded region 36 (B5b), and the bonded regions (B1f, B2a, B4e, B5b) aside from the bonded region 36 (B6d) are provided with the same relationship to the bonded region 36 (B6d). By setting the bonded regions 36 to which the wires 50 are bonded in this arrangement, the wires 50 is able to be bonded to the electrode regions 32a and 32b of the semiconductor chip 30 so as to be spread out. When doing so, the wires 50 are not bonded to prohibited bonding regions 37, which are the bonding regions 35 (A3c, A3d, A4c, A4d) in a center portion of the electrode areas 32a and 32b of the semiconductor chip 30. Note that the center portion of the electrode regions 32a and 32b that corresponds to the prohibited bonding regions 37 is a range of distance L1 from the midpoint of the electrode regions 32a and 32b and, for example, the distance L1 is 25% of the distance from the midpoint of the electrode regions 32a and 32b to each side of the semiconductor chip 30. This distance L1 may be set as appropriate.

Figure 5:
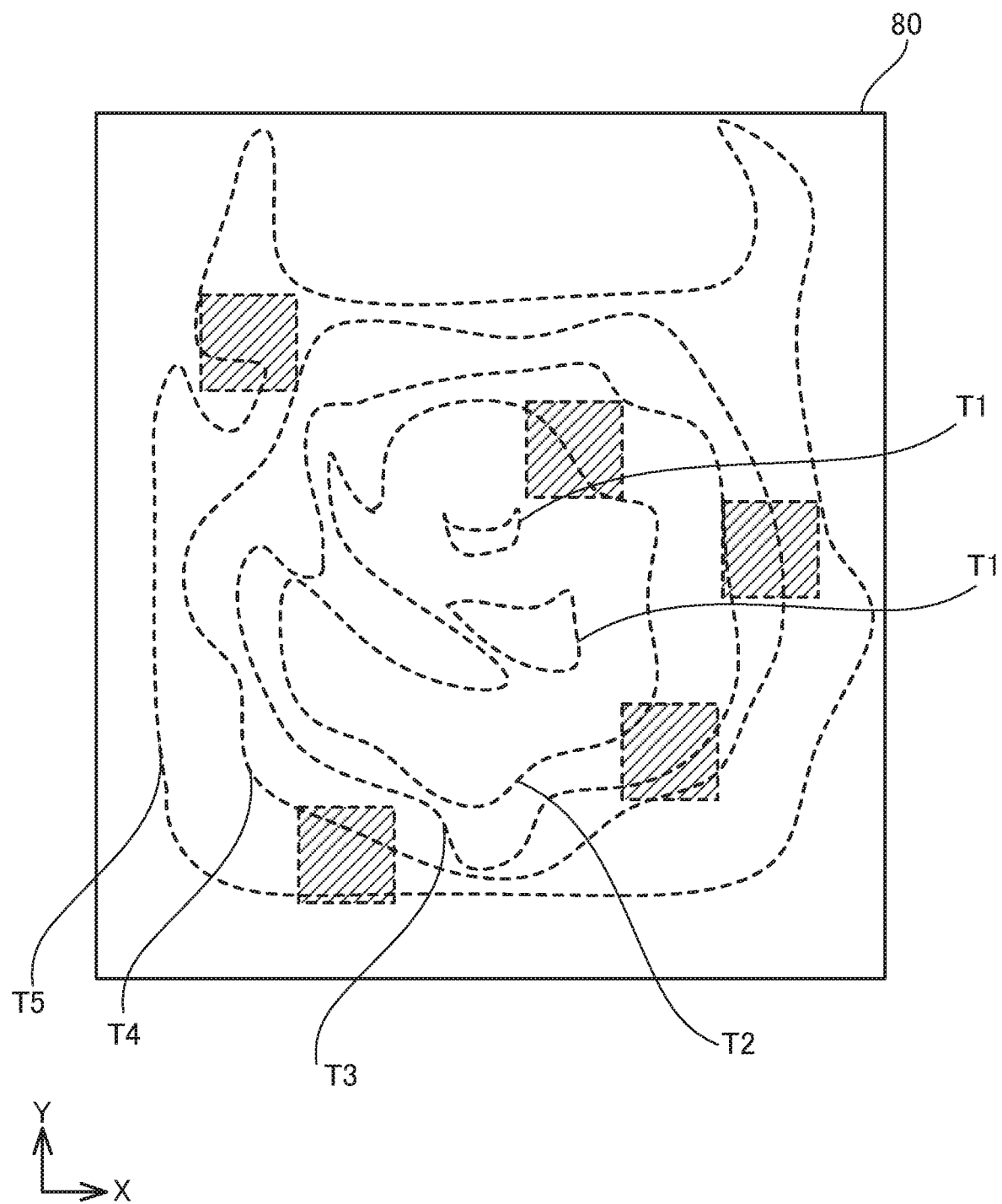
FIG. 5 depicts the surface temperature of a semiconductor chip according to the present embodiment.

Next, the surface temperature of the electrode regions 32a and 32b when powering the semiconductor chip 30 to which the wires 50 have been bonded in this way will be described with reference to FIG. 5. FIG. 5 depicts the surface temperature of a semiconductor chip according to the present embodiment. A temperature distribution graph 80 depicted in FIG. 5 depicts diagonally shaded regions respectively corresponding to the bonded regions 36 in FIG. 4 and lines (broken lines T1 to T5) that are temperature contours indicating areas where the temperature range is the same within predetermined intervals. The area surrounded by the broken line T1 indicates a temperature distribution of 119° C. to 130° C. The area surrounded by the broken line T2 indicates a temperature distribution of 116° C. to 119° C. The area surrounded by the broken line T3 indicates a temperature distribution of 112° C. to 116° C. The area surrounded by the broken line T4 represents a temperature distribution of 109° C. to 116° C. The area surrounded by the broken line T5 represents a temperature distribution of 105° C. to 109° C. According to the temperature distribution graph 80, the temperature is distributed substantially uniformly over the entire electrode regions 32a and 32b, and although there are high temperature areas (T1) in the center, it is understood that these areas (T1) are small and that areas with high temperatures as a whole are not unevenly distributed. At this time, the temperature of the heat generated by the semiconductor chip 30 was around 124° C.

Figure 6:
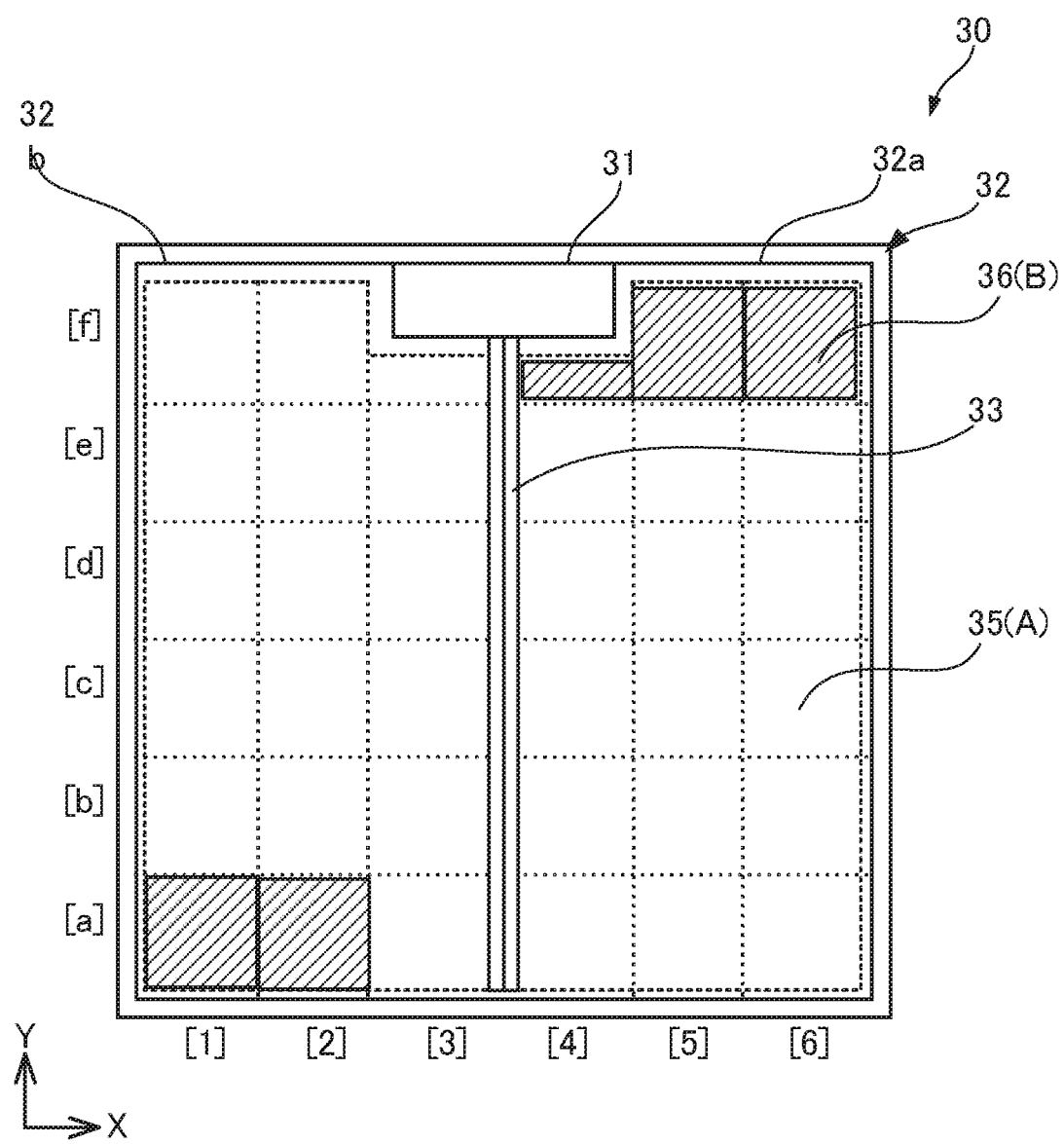
FIG. 6 depicts bonding locations of wires on a semiconductor chip that is a comparative example.

A semiconductor chip to be used as a comparative example for the configuration depicted in FIG. 4 will now be described with reference to FIG. 6. FIG. 6 depicts bonding locations of wires on a semiconductor chip that is a comparative example. Note that in FIG. 6 also, in the same way as FIG. 4, a case where five wires 50 are bonded to the electrode regions 32a and 32b of the semiconductor chip 30 will be described as an example. In FIG. 6, five wires 50 are bonded in five bonded regions 36 (the diagonally shaded regions "B" in FIG. 6) out of the plurality of bonding regions 35 ("A") of the electrode regions 32a and 32b of the semiconductor chip 30.

On the semiconductor chip 30 in FIG. 6, the bonded regions 36 (B1a, B2a, B4f, B5f, B6f), where the wires 50 are respectively bonded to the bonding regions 35 (A1a, A2a, A4f, A5f, A6f), are set out of the plurality of bonding regions 35. Bonding the wires 50 to the diagonally opposite corner portions of the electrode regions 32a and 32b in this way avoids the center portion where the temperature becomes the highest when the semiconductor chip 30 is powered, and is expected to suppress the rise in temperature.

Figure 7:
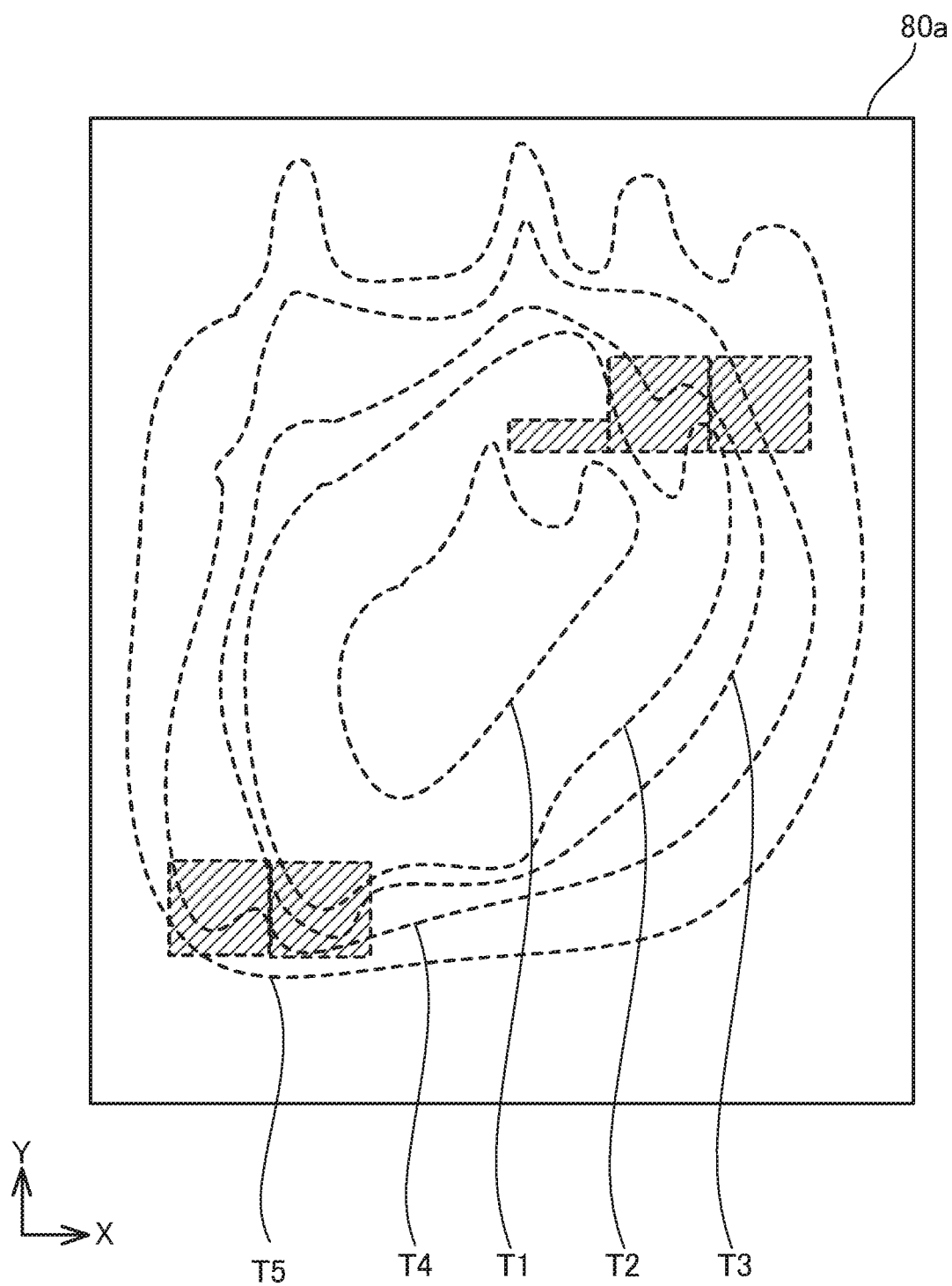
FIG. 7 depicts the surface temperature of a semiconductor chip that is a comparative example.

Next, the surface temperature of the electrode regions 32a and 32b when powering the semiconductor chip 30 to which the wires 50 have been bonded in FIG. 6 will be described with reference to FIG. 7. FIG. 7 depicts the surface temperature of a semiconductor chip that is a comparative example. In the same way as in FIG. 5, a temperature distribution graph 80a depicted in FIG. 7 depicts diagonally shaded regions respectively corresponding to the bonded regions 36 in FIG. 6 and lines (broken lines T1 to T5) that are temperature contours indicating areas where the temperature range is the same within predetermined intervals. From the temperature distribution graph 80a, it is understood that the temperature rises so as to straddle the bonded regions 36, which are located in diagonally opposite corner portions of the electrode regions 32a and 32b. In particular, it is understood that the center portion of the electrode regions 32a and 32b has a temperature distribution within the broken lines T1 and T2 indicating high temperatures. It is believed that this is due to thermal interference occurring between the diagonally opposite bonded regions 36, so that the temperature rises in the center portion of the electrode regions 32a and 32b of the semiconductor chip 30. In FIGS. 6 and 7, the area with the temperature distribution inside the broken lines T1 and T2 is larger than in the case depicted in FIGS. 4 and 5. The temperature of the heat generated by the semiconductor chip 30 at this time is around 127° C., which is around 2.5% higher than the temperature of the heat generated by the semiconductor chip 30 in FIG. 5.

The semiconductor device 10 described above includes the semiconductor chips 30 that have the electrode regions 32a and 32b on their front surfaces, and a plurality of wires 50 that are bonded to the electrode regions 32a and 32b. The plurality of bonded regions 36 in the electrode regions 32a and 32b to which the plurality of wires 50 are respectively bonded are laid out so that when viewed from above, the bonded regions 36 do not coincide in the X direction, which is parallel to one side of the semiconductor chip 30, and the Y direction, which is perpendicular to the X direction. By doing so, the wires 50 are bonded to the electrode regions 32a and 32b of the semiconductor chip 30 so as to be spread out, the temperature is distributed substantially uniformly across the entire electrode regions 32a and 32b, and an uneven distribution of regions with high temperature is suppressed. As a result, it is possible to suppress an increase in the temperature of heat generated by the semiconductor chip 30 and to suppress a drop in reliability for the semiconductor device 10.

In addition, in the case of FIG. 4, the wires 50 are bonded to outer edge portions of the electrode regions 32a and 32b. This is because the rise in temperature is particularly high at the center portion of the electrode regions 32a and 32b of the semiconductor chip 30, and therefore suppresses a further rise in temperature. Note that the expression "outer edge portions" of the electrode regions 32a and 32b refers to a range of distance L2 from each edge of the electrode regions 32a and 32b and, for example, the distance L2 is 50% of the distance from the midpoint of the electrode regions 32a and 2b to each side of the semiconductor chip 30. This distance L2 may be set as appropriate.

As one example, when the semiconductor chips 30 include an SiC-MOSFET or an SiC-SBD that is a switching element made of silicon carbide, the current that flows may be large. For semiconductor chips 30 of this type, the temperature of the bonded regions 36 where the wires 50 are bonded tend to rise. When the wires 50 are bonded to the bonded regions 36 as described above, the rise in temperature of the semiconductor device 10 is suppressed and large currents are reliably handled. Note that in the present embodiment, even for configurations aside from FIG. 4, the center portion and the outer edge portions of the electrode regions 32a and 32b are set as in FIG. 4.

Figure 8:
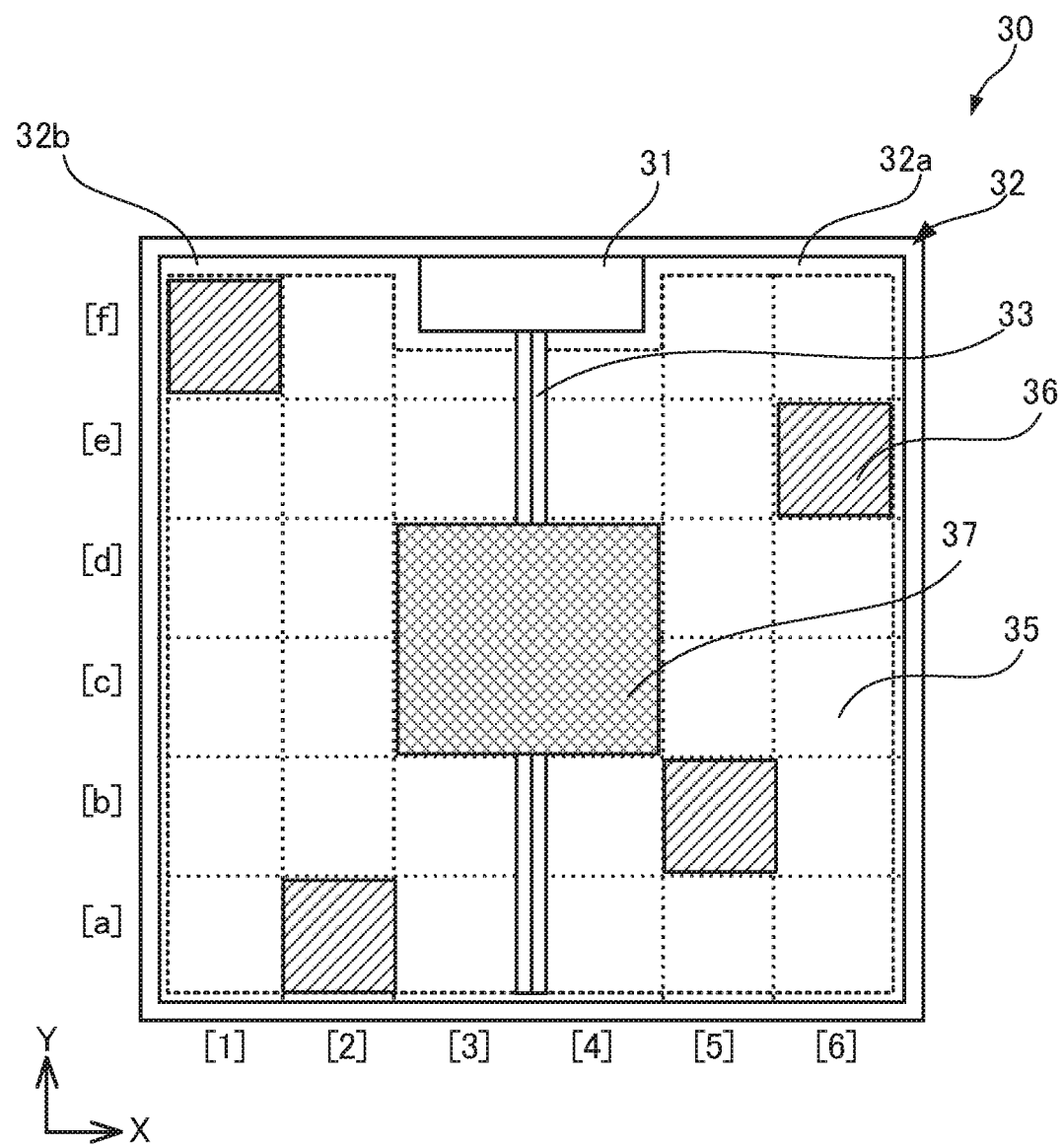
FIG. 8 depicts bonding locations of wires on a semiconductor chip according to the present embodiment.

Next, a case where four wires 50 are bonded to the electrode regions 32a and 32b of the semiconductor chip 30 will be described with reference to FIG. 8. FIG. 8 depicts bonding locations of wires on a semiconductor chip according to the present embodiment. In the same way as FIG. 4, the semiconductor chip 30 depicted in FIG. 8 also includes electrode regions 32a and 32b where a plurality of bonding regions 35 have been set. In FIG. 8, to bond the four wires 50, six bonding regions 35 are set along each of the X direction and the Y direction in a grid in the electrode regions 32a and 32b of the semiconductor chip 30. The bonding regions 35 may be set in a grid where the entire lengths along the X direction and the Y direction are divided by the number of wires 50 or a greater number as illustrated in FIG. 8. More preferably, the bonding regions 35 are set in a grid produced by dividing along the X direction and the Y direction into the same number as the number of wires 50. A total of four wires 50 are individually bonded to four bonded regions 36 (the diagonally shaded areas in FIG. 8) out of the plurality of bonding regions 35. When doing so, the plurality of bonded regions 36 in the electrode regions 32a and 32b to which the individual wires 50 are bonded are laid out so that when viewed from above, the bonded regions 36 do not coincide in the X direction, which is parallel to one side of the semiconductor chip 30, and the Y direction, which is perpendicular to the X direction.

As examples, out of the four bonded regions 36, the bonded regions (B2a, B5b, B6e) aside from the bonded region 36 (B1f) will now be described. The bonded regions (B2a, B5b, B6e) are set so as to not coincide with bonding regions 35 (A1f to A6f, A1a to A1f) that are aligned in the X and Y directions with the bonded region 36 (B1f), out of all of the bonding regions 35. That is, the bonded regions (B2a, B5b, B6e) aside from the bonded region 36 (B1f) are provided in bonding regions 35 aside from the bonding regions 35 (A1f to A6f, A1a to A1f) that include the bonded region 36 (B1f). The bonded regions (B1f, B5b, B6e) aside from the bonded region 36 (B2a) are provided with the same relationship to the bonded region 36 (B2a), the bonded regions (B1f, B2a, B6e) aside from the bonded region 36 (B5b) are provided with the same relationship to the bonded region 36 (B5b), and the bonded regions (B1f, B2a, B5b) aside from the bonded region 36 (B6e) are provided with the same relationship to the bonded region 36 (B6e).

Figure 9:
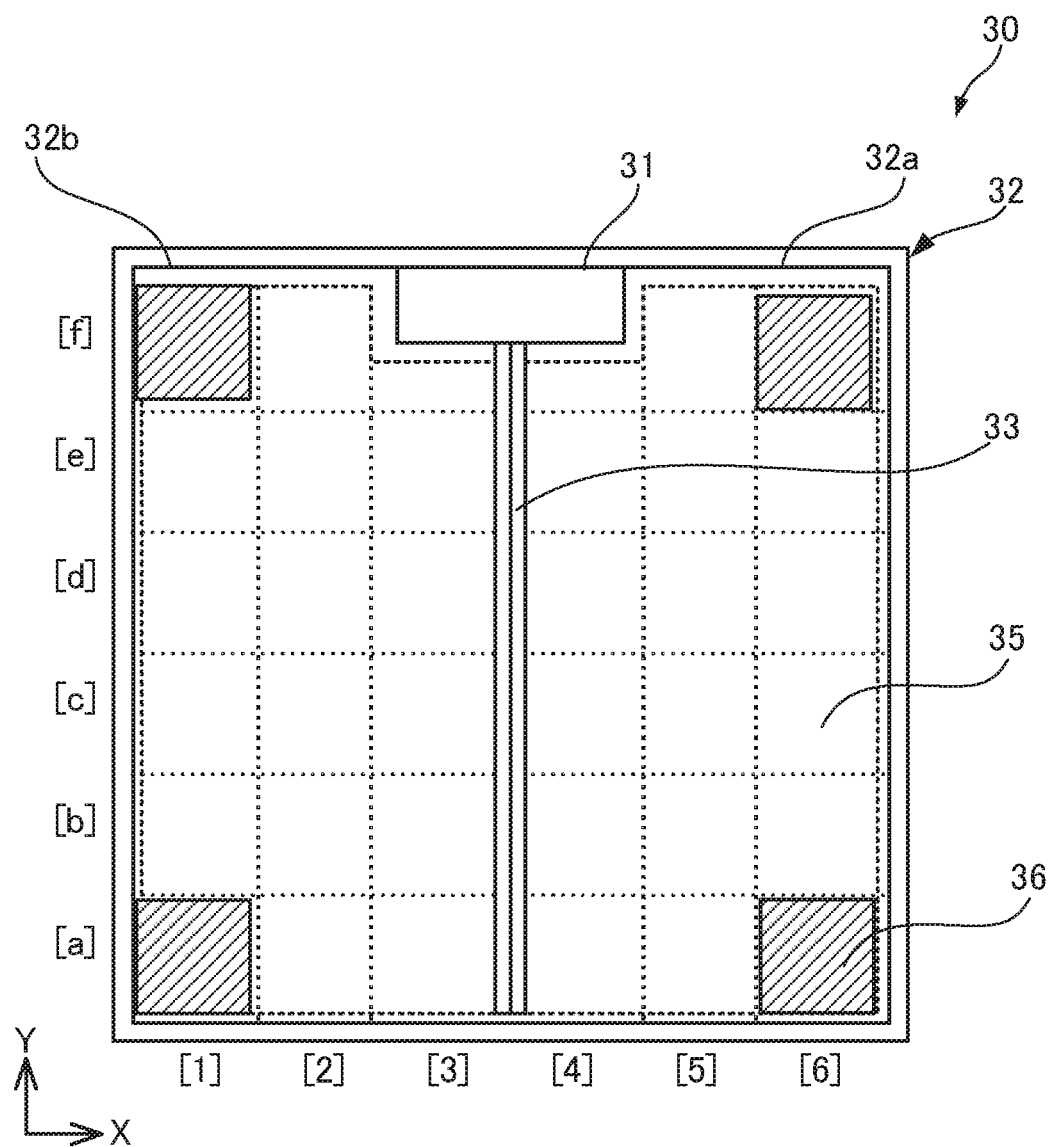
FIG. 9 depicts bonding locations of wires on a semiconductor chip that is a comparative example.

As a comparative example for the configuration in FIG. 8, a case where the wires 50 are simply bonded to the four corners of the electrode regions 32a and 32b of the semiconductor chip 30 will now be described with reference to FIG. 9. FIG. 9 depicts bonding locations of wires on a semiconductor chip that is a comparative example. As depicted in FIG. 9, the bonded regions 36 (B1a, B1f, B6a, B6f) are respectively set in the bonding regions 35 (A1a, A1f, A6a, A6f) in the corner portions of the electrode regions 32a and 32b of the semiconductor chip 30. However, when the bonded regions 36 (B1a, B1f, B6a, B6f) are set at the four corners of the electrode regions 32a and 32b of the semiconductor chip 30, thermal interference occurs between the bonded regions 36 (B1a, B1f, B6a, B6f). As a result, the temperature of the center portion of the electrode regions 32a and 32b of the semiconductor chip 30 rises, and the temperature of the heat generated by the semiconductor chip 30 in FIG. 9 becomes higher than the case in FIG. 8.

Accordingly, by setting the bonded regions 36 to which the four wires 50 are bonded as depicted in FIG. 8, it is possible to bond the wires 50 to the electrode regions 32a and 32b of the semiconductor chip 30 so as to be spread out. When doing so, the wires 50 are not bonded to the prohibited bonding regions 37 that are the bonding regions 35 (A3c, A3d, A4c, A4d) in the center portion of the electrode areas 32a and 32b of the semiconductor chip 30. By doing so, the wires 50 are bonded to the electrode regions 32a and 32b of the semiconductor chip 30 so as to be spread out, the temperature is distributed substantially uniformly across the entire electrode regions 32a and 32b, and an uneven distribution of regions with high temperature is suppressed. As a result, it is possible to suppress an increase in the temperature of the heat generated by the semiconductor chip 30 and possible to suppress a drop in reliability for the semiconductor device 10.

Figure 10:
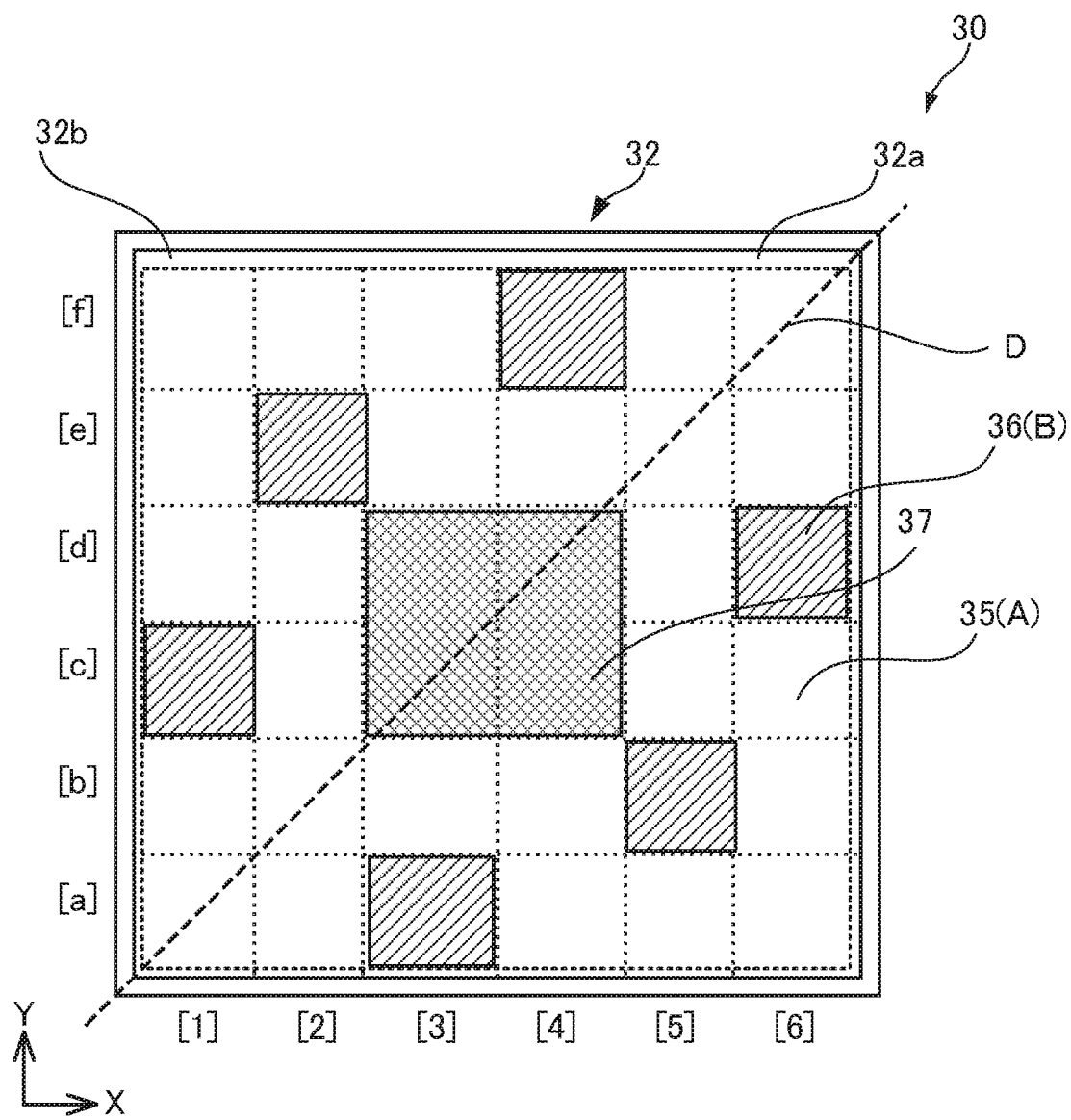
FIG. 10 depicts bonding locations of wires on a semiconductor chip according to the present embodiment.

Next, a case where six wires 50 are bonded to the electrode regions 32a and 32b of the semiconductor chip 30 will be described with reference to FIG. 10. FIG. 10 depicts bonding locations of wires on a semiconductor chip according to the present embodiment. In the same way as FIGS. 4 and 8, the semiconductor chip 30 depicted in FIG. 10 includes the electrode regions 32a and 32b where a plurality of bonding regions 35 have been set. In FIG. 10, to bond the six wires 50, six bonding regions 35 are set along each of the X direction and the Y direction in a grid in the electrode regions 32a and 32b of the semiconductor chip 30. The bonding regions 35 may be set in a grid where the entire lengths along the X direction and the Y direction are divided by the number of wires 50 or a greater number. More preferably, as depicted in FIG. 10, the bonding regions 35 are set in a grid by dividing along the X direction and the Y direction into the same number as the number of wires 50. A total of six wires 50 are individually bonded to six bonded regions 36 (the diagonally shaded areas in FIG. 10) out of the plurality of bonding regions 35. When doing so, the plurality of bonded regions 36 in the electrode regions 32a and 32b to which the individual wires 50 are bonded are laid out so that when viewed from above, the bonded regions 36 do not coincide in the X direction, which is parallel to one side of the semiconductor chip 30, and the Y direction, which is perpendicular to the X direction.

The bonded regions 36 in the configuration in FIG. 10 are provided in the electrode regions 32a and 32b aside from the prohibited bonding regions 37 in the center portion. In this configuration, every pair of two bonded regions 36 selected from the six bonded regions 36 is provided so as to have point symmetry with respect to the center point. As one example, the pair of bonded regions 36 (B1c, B6d) are provided so as to have point symmetry with respect to the center point. Likewise, the pair of bonded regions 36 (B2e, B5b) are provided so as to have point symmetry with respect to the center point, and the pair of bonded regions 36 (B3a, B4f) are provided so as to have point symmetry with respect to the center point. In addition, the bonded regions 36 are laid out so as to have line symmetry with respect to a diagonal D of the electrode regions 32a and 32b. As one example, the pair of bonded regions 36 (B1c, B3a) are provided so as to have line symmetry with respect to the diagonal D. Likewise, the pair of bonded regions 36 (B2e, B5b) are provided so as to have line symmetry with respect to the diagonal D and the pair of bonded regions 36 (B4f, B6d) are provided so as to have line symmetry with respect to the diagonal D.

For any configuration with an even number of wires 50, it is possible to dispose an even number of bonded regions 36 in this way in the electrode regions 32a and 32b of the semiconductor chip 30. When doing so, it is possible to lay out the bonded regions 36 so as to have point symmetry with respect to the center point. In addition, the bonded regions 36 may be laid out so as to have line symmetry with respect to the diagonal D of the electrode regions 32a and 32b. By laying out the bonded regions 36 in this way and bonding individual wires 50 to the bonded regions 36, the wires 50 may be spread out on the electrode regions 32a and 32b of the semiconductor chip 30. By doing so, the temperature is distributed substantially uniformly across the entire electrode regions 32a and 32b, and an uneven distribution of regions with high temperature is suppressed. As a result, it is possible to suppress an increase in the temperature of heat generated by the semiconductor chip 30, and possible to suppress a drop in reliability for the semiconductor device 10.

In the above description, the number of bonding regions 35 in the electrode regions 32a and 32b of the semiconductor chip 30 is a mere example. The present embodiment is not limited to the X direction and the Y direction both being divided into six, and it is possible to set the number of bonding regions 35 as appropriate in keeping with the areas of the electrode regions 32a and 32b and the number and diameters of the wires 50. For an even number of wires 50, an even number of bonded regions 36 may be laid out in the electrode regions 32a and 32b of the semiconductor chip 30.

Figure 11:
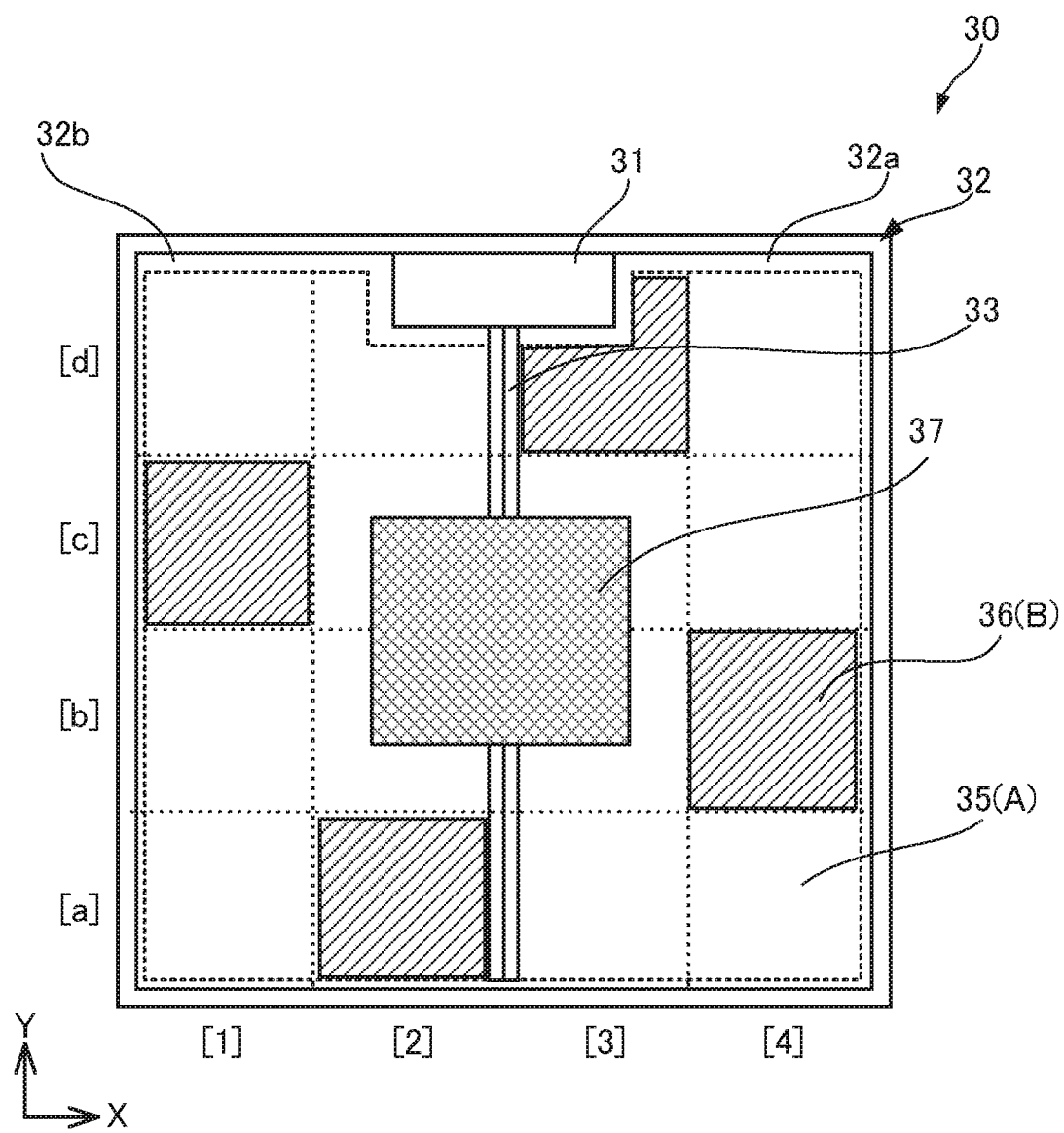
FIG. 11 depicts bonding locations of wires on a semiconductor chip according to the present embodiment.

For this reason, as another example, a configuration where the electrode regions 32a and 32b of the semiconductor chip 30 are divided into four in the X direction and four in the Y direction will now be described with reference to FIG. 11. FIG. 11 depicts bonding locations of wires on a semiconductor chip according to the present embodiment. Note that in this example, four wires 50 are bonded to the electrode regions 32a and 32b of the semiconductor chip 30. As depicted in FIG. 11, to bond the four wires 50, four bonding regions 35 are set along each of the X and Y directions in a grid in the electrode regions 32a and 32b of the semiconductor chip 30. The bonding regions 35 may be set in a grid where the entire lengths along the X direction and the Y direction are divided by the number of wires 50 or a larger number. More preferably, as depicted in FIG. 11, the bonding regions 35 are set in a grid produced by dividing along the X direction and the Y direction into the same number as the number of wires 50. A total of four wires 50 are individually bonded to four bonded regions 36 (the diagonally shaded regions in FIG. 11) out of the plurality of bonding regions 35. When doing so, the plurality of bonded regions 36 in the electrode regions 32a and 32b to which the plurality of wires 50 are bonded are laid out so that when looking from above, the bonded regions 36 do not coincide in the X direction, which is parallel to one side of the semiconductor chip 30, and the Y direction, which is perpendicular to the X direction. In this configuration, every pair of two bonded regions 36 selected from the four bonded regions 36 is provided so as to have point symmetry with respect to the center point. As one example, the pair of bonded regions 36 (B1c, B4b) are provided so as to have point symmetry with respect to the center point. Likewise, the pair of bonded regions 36 (B2a, B3d) are provided so as to have point symmetry with respect to the center point. In addition, these bonded regions 36 are provided so that a straight line that joins the bonded regions 36 (B1c, Bob) and a straight line that joins the bonded regions 36 (B2a, B3d) are substantially perpendicular.

Figure 12:
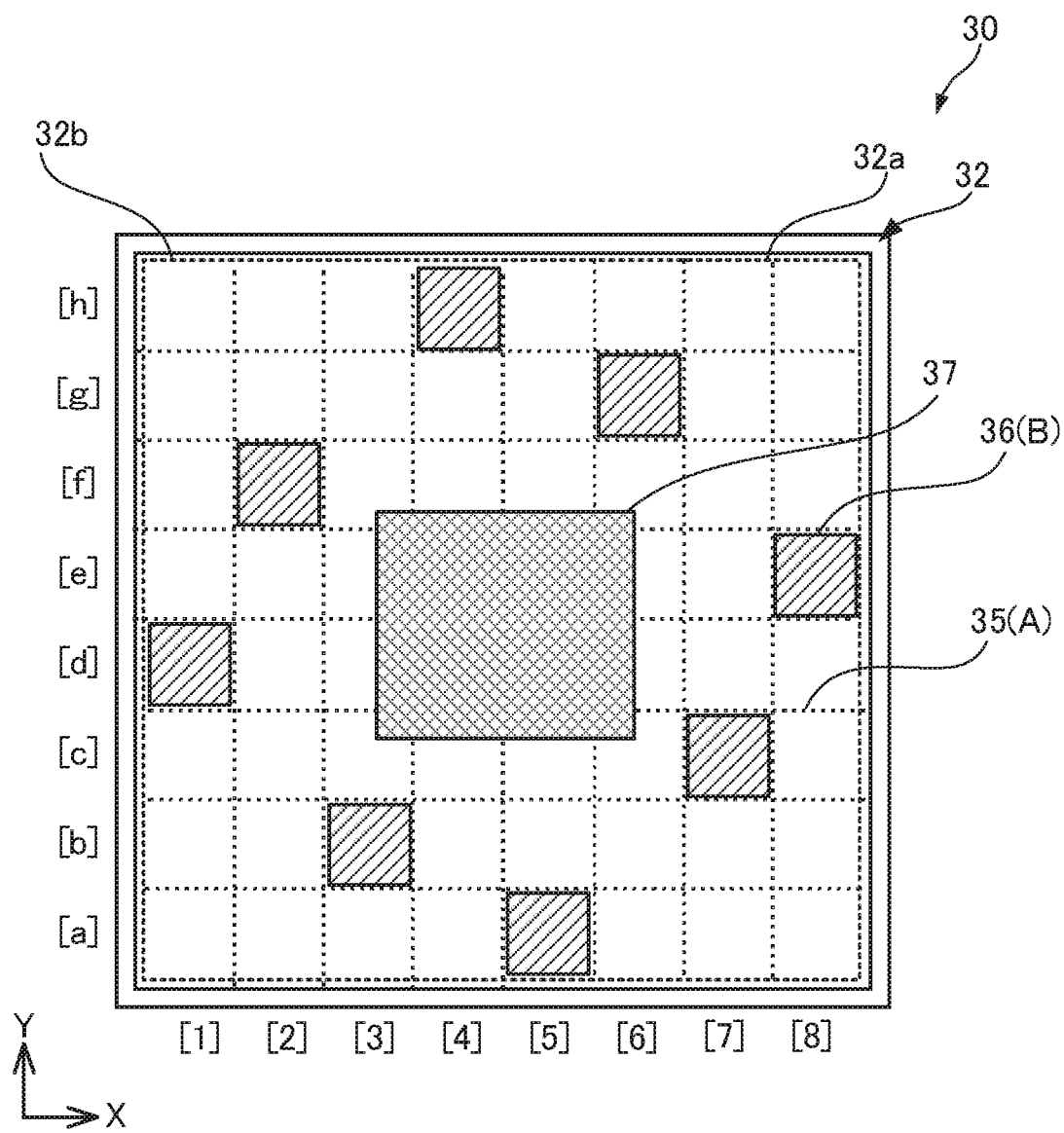
FIG. 12 depicts bonding locations of wires on a semiconductor chip according to the present embodiment.

As another example, a configuration where the electrode regions 32a and 32b of the semiconductor chip 30 are divided into eight in the X direction and the Y direction will be described with reference to FIG. 12. FIG. 12 depicts bonding locations of wires on a semiconductor chip according to the present embodiment. Note that in this example, eight wires 50 are bonded to the electrode regions 32a and 32b of the semiconductor chip 30. As depicted in FIG. 12, to bond the eight wires 50, eight bonding regions 35 are set along each of the X direction and the Y direction in a grid in the electrode regions 32a and 32b of the semiconductor chip 30. The bonding regions 35 may be set in a grid where the entire lengths along the X direction and the Y direction are divided into the same number as the number of wires 50 or larger. More preferably, as depicted in FIG. 12, the bonding regions 35 are set in a grid produced by dividing the lengths along the X direction and the Y direction into the same number as the number of wires 50. A total of eight wires 50 are individually bonded to eight bonded regions 36 (the diagonally shaded regions in FIG. 12) out of the plurality of bonding regions 35. When doing so, the plurality of bonded regions 36 in the electrode regions 32a and 32b to which the plurality of wires 50 are bonded are laid out so that when looking from above, the bonded regions 36 do not coincide in the X direction, which is parallel to one side of the semiconductor chip 30, and the Y direction, which is perpendicular to the X direction. In this configuration, every pair of two bonded regions 36 selected from the eight bonded regions 36 is provided so as to have point symmetry with respect to the center point. As one example, the pair of bonded regions 36 (Bid, B8e) is provided so as to have point symmetry with respect to the center point. Likewise, the pair of bonded regions 36 (B2f, B7c) is provided so as to have point symmetry with respect to the center point, the pair of bonded regions 36 (B3b, B6g) is provided so as to have point symmetry with respect to the center point, and the pair of bonded regions 36 (B4h, B5a) is provided so as to have point symmetry with respect to the center point.

As depicted in FIGS. 11 and 12, when the number of wires 50 for the electrode regions 32a and 32b of a semiconductor chip 30 is even, it is possible to lay out an even number of bonded regions 36, which are located so as to have point symmetry with respect to the center point. By laying out the bonded regions 36 in this way and bonding individual wires 50 to the bonded regions 36, the wires 50 are bonded to the electrode regions 32a and 32b of the semiconductor chip 30 so as to be spread out. By doing so, the temperature is distributed substantially uniformly across the entire electrode regions 32a and 32b, and an uneven distribution of regions with high temperature is suppressed. As a result, it is possible to suppress an increase in the temperature of the heat generated by the semiconductor chip 30 and to suppress a drop in reliability for the semiconductor device 10.

Note that when there are three or fewer wires 50, even when the bonded regions 36 are set so as to be spread out as depicted in FIGS. 4, 8, and 10 to 12, the ability to suppress an increase in the temperature of the heat generated by the semiconductor chip 30 will hardly change compared to a configuration where the bonded regions 36 are simply set on the outer edge portions of the electrode regions 32a and 32b of the semiconductor chip 30. For this reason, it is preferable for there to be at least four wires 50. Likewise, when the size of the semiconductor chip 30 is large and the number of wires is small, even when the bonded regions 36 are set so as to be spread out as depicted in FIGS. 4, 8, and 10 to 12, the ability to suppress an increase in the temperature of the heat generated by the semiconductor chip 30 will hardly change compared to a configuration where the bonded regions 36 are simply set on the outer edge portions of the electrode regions 32a and 32b of the semiconductor chip 30. For this reason, it is especially desirable for the semiconductor chip 30 to have a size of 7 mm or less in each of the vertical and horizontal directions and for the number of wires 50 to be at least four. Also, although the present embodiment describes configurations where the number of divisions of the electrode regions 32a and 32b of the semiconductor chip 30 is the same at four, six, and eight in both the X direction and the Y direction, these are mere examples and the X direction and Y direction may be divided into different numbers of regions. As one example, there may be four divisions in the X direction and six divisions in the Y direction.

According to the present embodiment, it is possible to suppress a rise in temperature of surface electrodes of a semiconductor chip to which wires are bonded and to suppress a drop in reliability for a semiconductor device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
   a semiconductor chip having a first main electrode on a front surface thereof and a second main electrode on a rear surface thereof, the first main electrode having a plurality of bonded regions;
   a conductive plate; and
   a plurality of wires that are bonded respectively to the plurality of bonded regions of the first main electrode and that connect the semiconductor chip and the conductive plate, wherein
   in a top view of the semiconductor device, no two of the plurality of bonded regions overlap in a predetermined first direction, or in a second direction perpendicular to the predetermined first direction, and
   each of the plurality of wires has two ends, which are respectively connected to the semiconductor chip and the conductive plate.

2. The semiconductor device according to claim 1, wherein
   the second main electrode of the semiconductor chip is connected to the conductive plate via a bonding member.

3. The semiconductor device according to claim 1, wherein the plurality of wires includes at least four wires.

4. The semiconductor device according to claim 1, wherein
   the front surface has a center portion and an outer edge portion; and
   the plurality of bonded regions are disposed on a part of the front surface aside from the center portion.

5. The semiconductor device according to claim 1, wherein
   the front surface has a center portion and an outer edge portion; and
   the plurality of bonded regions are disposed on the outer edge portion of the front surface.

6. The semiconductor device according to claim 1, wherein the plurality of bonded regions are of an even number.

7. The semiconductor device according to claim 1, wherein the semiconductor chip includes a diode or a switching element.

8. The semiconductor device according to claim 1, wherein the semiconductor chip is made of silicon carbide.

9. The semiconductor device according to claim 1, wherein
   the semiconductor chip is of a substantially rectangular shape, and
   the predetermined first direction is parallel to a side of the substantially rectangular shape.

10. A semiconductor device, comprising:
    a semiconductor chip having a first main electrode on a front surface thereof, the first main electrode having a plurality of bonded regions; and
    a plurality of wires that are bonded respectively to the plurality of bonded regions of the first main electrode, wherein
    in a top view of the semiconductor device, no two of the plurality of bonded regions overlap in a predetermined first direction, or in a second direction perpendicular to the predetermined first direction;
    the plurality of bonded regions are of an even number;
    the front surface has a center point and an outer edge portion; and
    the plurality of bonded regions are provided in pairs, each pair being so laid out as to have point symmetry about the center point of the front surface.

11. The semiconductor device according to claim 10, wherein the plurality of bonded regions include four bonded regions laid out in the outer edge portion of the front surface.

12. The semiconductor device according to claim 11, wherein, for the four bonded regions provided in two pairs, a straight line that joins one pair and a straight line that joins the other pair are substantially perpendicular.

13. The semiconductor device according to claim 10, wherein the plurality of bonded regions are laid out so as to have line symmetry with respect to a straight line that passes the center point of the front surface.

14. A semiconductor device, comprising:
    a semiconductor chip having a first main electrode on a front surface thereof, the first main electrode having a plurality of bonded regions; and
    a plurality of wires that are bonded respectively to the plurality of bonded regions of the first main electrode, wherein
    in a top view of the semiconductor device, no two of the plurality of bonded regions overlap in a predetermined first direction, or in a second direction perpendicular to the predetermined first direction; and
    the semiconductor chip is of a substantially rectangular shape, a length of each side thereof being 7 mm or shorter.

* * * * *